(12) United States Patent
Kanazawa et al.

(10) Patent No.: US 6,266,798 B1
(45) Date of Patent: Jul. 24, 2001

(54) MULTI-POWER SUPPLY INTEGRATED CIRCUIT EVALUATION SYSTEM AND METHOD OF OPERATING THE SAME

(75) Inventors: Masahiro Kanazawa; Kimiyoshi Usami, both of Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/310,588

(22) Filed: May 12, 1999

(30) Foreign Application Priority Data

May 12, 1998 (JP) .................................................. 10-129245

(51) Int. Cl.[7] ...................................................... G06F 17/50
(52) U.S. Cl. ........................................................... 716/4
(58) Field of Search ...................................................... 716/4

(56) References Cited

U.S. PATENT DOCUMENTS

| | | | |
|---|---|---|---|
| 5,389,874 | * 2/1995 | King et al. .............................. | 716/4 |
| 5,594,368 | 1/1997 | Usami ..................................... | 326/80 |
| 5,625,566 | * 4/1997 | Chian ..................................... | 716/4 |
| 6,029,177 | * 2/2000 | Sadiq et al. ............................ | 716/4 |

* cited by examiner

Primary Examiner—Trong Phan
(74) Attorney, Agent, or Firm—Foley & Lardner

(57) ABSTRACT

There are disclosed a multi power supply integrated circuit evaluating method which is capable of detecting power supply voltage illegal connection, redundant connection, and potential redundant connection from connection descriptions contained in a multi power supply integrated circuit in the stage of circuit design and then correcting automatically such connections, and a system for embodying the same. The evaluating method comprises at least the steps of inputting a database in which various cells are registered and the connection descriptions of the multi power supply integrated circuit, detecting connections corresponding to the power supply voltage illegal connection, the redundant connection, and the potential redundant connection, registering the detected connections as the power supply voltage illegal connection, the redundant connection, and the potential redundant connection, outputting the power supply voltage illegal connection, the redundant connection, and the potential redundant connection, and correcting automatically the power supply voltage illegal connection, the redundant connection, and the potential redundant connection.

20 Claims, 15 Drawing Sheets

RC : REDUNDANT CONNECTION
PIC : POWER SUPPLY VOLTAGE ILLEGAL CONNECTION

FIG.14

| OUTPUT SIDE \ INPUT SIDE | VDDH CELL | VDDL CELL | LC CELL | LEVEL CONVERTIBLE CELL | PRIMARY OUTPUT TERMINAL |
|---|---|---|---|---|---|
| VDDH CELL | ○ | ○ | ▲ | ○△ | ○ |
| VDDL CELL | × | ○ | ○ | ○ | × |
| LC CELL | ○ | ○▲ | ▲ | ○▲ | ○ |
| LEVEL CONVERTIBLE CELL | ○ | ○△ | ▲ | ○△ | ○ |
| PRIMARY OUTPUT TERMINAL | ○ | ○ | ▲ | ○△ | ○ |

○ : OK
× : POWER SUPPLY VOLTAGE ILLEGAL CONNECTION
▲ : REDUNDANT CONNECTION
△ : POTENTIAL REDUNDANT CONNECTION

US 6,266,798 B1

MULTI-POWER SUPPLY INTEGRATED CIRCUIT EVALUATION SYSTEM AND METHOD OF OPERATING THE SAME

BACKGROUND OF THE INVENTION

1. Field of the Invention

The present invention relates to a multi power supply integrated circuit evaluating system for evaluating a multi power supply integrated circuit employing a plurality of power supply voltages and a method of operating the same and, more particularly, a multi power supply integrated circuit evaluating system for evaluating the connectivity between constituent elements of a multi power supply integrated circuit and a method of operating the same.

2. Description of the Related Art

With the increase of the integration density of the semiconductor integrated circuit, lower power consumption is requested more and more. Most of the power consumption of the CMOS circuit constituting the semiconductor integrated circuit is caused by charge and discharge of the load capacitance. For example, there are a drain capacitance, a gate capacitance, etc. of the MOS transistor constituting the CMOS circuit as the load capacitance. It is very effective for the lower power consumption of the CMOS circuit to reduce the power supply voltage. However, if the power supply voltages of allover circuit are reduced uniformly, a circuit operation becomes slow. As a result, a breach of the constraint in the circuit timing is brought about, so that there is a possibility that the circuit does not operate normally. For this reason, there has been proposed the approach in which a high potential cell (VDDH cell) driven by a high potential power supply voltage (VDDH) is employed in critical paths with a high timing accuracy and also a low potential cell (VDDL cell) driven by a low potential power supply voltage (VDDL) is applied to paths with a margin in the timing accuracy. According to this approach, lower power consumption of the CMOS circuit can be achieved while maintaining a high speed performance of overall circuit.

According to such design concept, the inventors of the present invention have examined the multi power supply integrated circuit. As a result, it has been found that, in the CMOS circuit utilizing multi power supply voltages, for example, two power supply voltages consisting of a high potential power supply voltage (VDDH) and a low potential power supply voltage (VDDL), a through current is generated in the high potential cell being driven by a high potential power supply voltage if a particular connectivity can be achieved, as described in the following.

FIG. 1 is an equivalent circuit diagram showing a part of a dual power supply integrated circuit employing two power supply voltages. As shown in FIG. 1, the dual power supply integrated circuit is composed of a CMOS circuit which constitutes a high potential cell (VDDH cell) 101 which is driven by a high potential power supply voltage (VDDH) and consists of a p-type MOS transistor 103 and an n-type MOS transistor 105, and a CMOS circuit which constitutes a low potential cell (VDDL cell) 107 which is driven by a low potential power supply voltage (VDDL) and consists of a p-type MOS transistor 109 and an n-type MOS transistor 111. A signal which is output from the low potential cell 107 is input into the high potential cell 101. As shown in FIG. 1, a connection between an output node of the low potential cell 107 and an input node of the high potential cell 101 is called a power supply voltage illegal connection.

FIG. 1 is an equivalent circuit diagram showing a part of a dual power supply integrated circuit employing two power supply voltages. As shown in FIG. 1, the dual power supply integrated circuit is composed of a CMOS circuit which constitutes a high potential cell (VDDH cell) 101 which is driven by a high potential power supply voltage (VDDH) and consists of a p-type MOS transistor 103 and an n-type MOS transistor 105, and a CMOS circuit which constitutes a low potential cell (VDDL cell) 107 which is driven by a low potential power supply voltage (VDDL) and consists of a p-type MOS transistor 109 and an n-type MOS transistor 111. A signal which is output from the low potential cell 107 is input into the high potential cell 101. As shown in FIG. 1, a connection between an output node of the low potential cell 107 and an input node of the high potential cell 101 is called a power supply voltage illegal connection.

In FIG. 1, when the high potential cell 101 receives a low level (GND level) signal from the low potential cell 107, the p-type MOS transistor 103 is brought into a conduction state and the n-type MOS transistor 105 is brought into a non-conduction state. In contrast, when the high potential cell 101 receives a high level (VDDL level) signal from the low potential cell 107, the p-type MOS transistor 103 is brought into the non-conduction state and the n-type MOS transistor 105 is brought into the conduction state. That is, either of the p-type MOS transistor 103 and the n-type MOS transistor 105 is brought into the non-conduction state. However, a high level signal which is output from the low potential cell 107 is at a low potential power supply voltage (VDDL) level. Therefore, according to a threshold value voltage (Vthp) of the p-type MOS transistor 103 of the high potential cell 101, such a situation is caused that the p-type MOS transistor 103 cannot be perfectly cut off. In other words, if $$\text{VDDL} < \text{VDDH} - |\text{Vthp}| \quad (1)$$

is satisfied, the p-type MOS transistor 103 cannot be cut off. As a result, a through current Is is flown from the high potential power supply voltage (VDDH) to ground potential (GND) via the p-type MOS transistor 103 and the n-type MOS transistor 105. This through current Is causes increase of the power consumption of the circuit. In addition, there is a possibility that circuit performances become unstable.

Accordingly, in order to suppress the through current Is caused by the power supply voltage illegal connection, as shown in FIG. 2, a level converter cell (LC cell) 113 is provided between an output node of the low potential cell 107 and an input node of the high potential cell 101, the high level output signal of the low potential cell 107 must be changed from the low potential power supply voltage (VDDL) level to the high potential power supply voltage (VDDH) level. However, insertion of level converter cells 113 is overhead of the power consumption in the circuit. Therefore, unnecessary level converter cells consume wastefully the power. For this reason, in order to reduce the power consumption in the circuit, the level converter cells must be placed only at locations corresponding to the power supply voltage illegal connection. In addition, it is preferable that the level converter cells are deleted from the redundant connection in which the level converter cells are placed despite that the level converter cells are not needed essentially.

However, in the prior art, there has been provided no approach which can decide locations corresponding to the above power supply voltage illegal connections and the redundant connections without fail in the stage of circuit design. Therefore, it has been impossible to reduce the power consumption in the circuit by inserting or deleting the level converter cells in the stage of circuit design.

SUMMARY OF THE INVENTION

The present invention has been made in light of the above circumstances, and it is an object of the present invention to provide a multi power supply integrated circuit evaluating system which is capable of detecting power supply voltage illegal connection, redundant connection, and potential redundant connection in the stage of circuit design, and a method of operating the same.

It is another object of the present invention to provide a multi power supply integrated circuit evaluating system which is capable of correcting automatically the detected power supply voltage illegal connection, the detected redundant connection, and the detected potential redundant connection to achieve lower power consumption of the multi power supply integrated circuit, and a method of operating the same. The power supply voltage illegal connection is a connection between an output node of a VDDL cell and an input node of a VDDH cell. The redundant connection is a connection in which level converter cells or level convertible cells are placed wastefully irrespective that no power supply voltage breach is caused. The potential redundant connection is a connection in which the level converter cells or the level convertible cells are placed through they are not always necessary.

In order to achieve the above object, according to the present invention, a database in which various cells are registered and connection descriptions of a multi power supply integrated circuit are input, then connections corresponding to the power supply voltage illegal connection, the redundant connection, and the potential redundant connection are detected by using the database and the connection descriptions, then detected connections are registered as the power supply voltage illegal connection, the redundant connection, and the potential redundant connection, and then the power supply voltage illegal connection, the redundant connection, and the potential redundant connection are output.

According to the above configuration, the power supply voltage illegal connection, the redundant connection, and the potential redundant connection can be detected at a high speed without fail in the stage of circuit design. Based n this detection, it is possible to correct easily the power supply voltage illegal connection, the redundant connection, and the potential redundant connection in the stage of circuit design. Therefore, it is possible to design easily the multi power supply integrated circuit of low power consumption. In addition, if the power supply voltage illegal connection, the redundant connection, and the potential redundant connection can be corrected automatically, it is possible to design the multi power supply integrated circuit of low power consumption at a high speed and precisely.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 14 is a view showing a table which is employed to detect power supply voltage illegal connection, redundant connection, and potential redundant connection.

DESCRIPTION OF THE PREFERRED EMBODIMENTS

Figure 1:
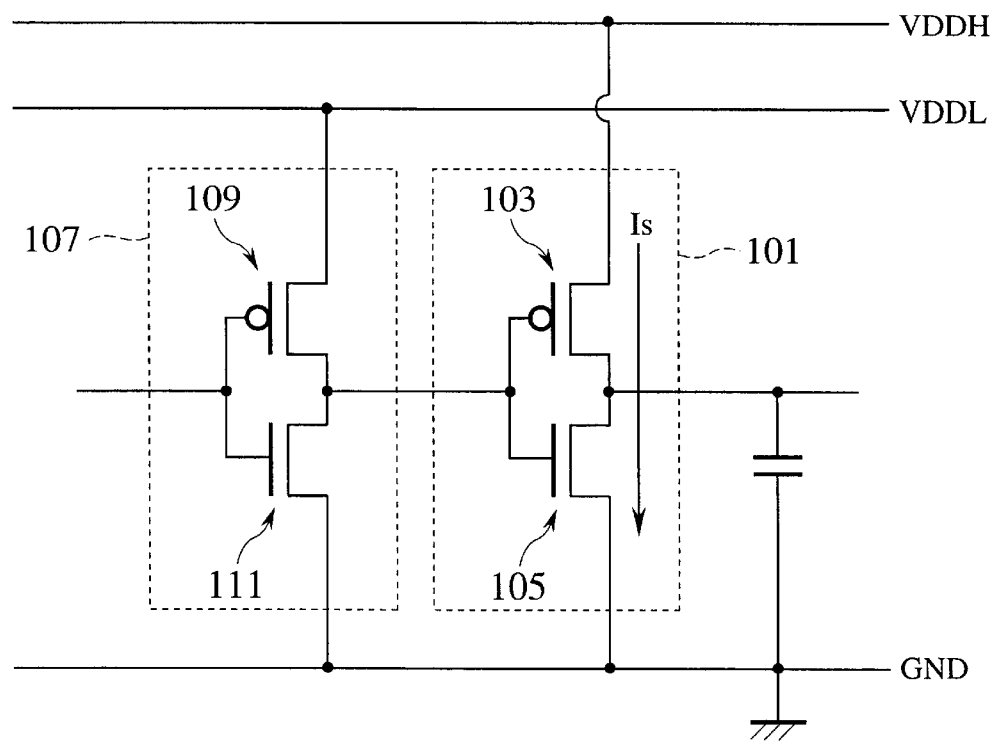
FIG. 1 is an equivalent circuit diagram showing a part of a dual power supply integrated circuit employing two power supply voltages.
Figure 2:
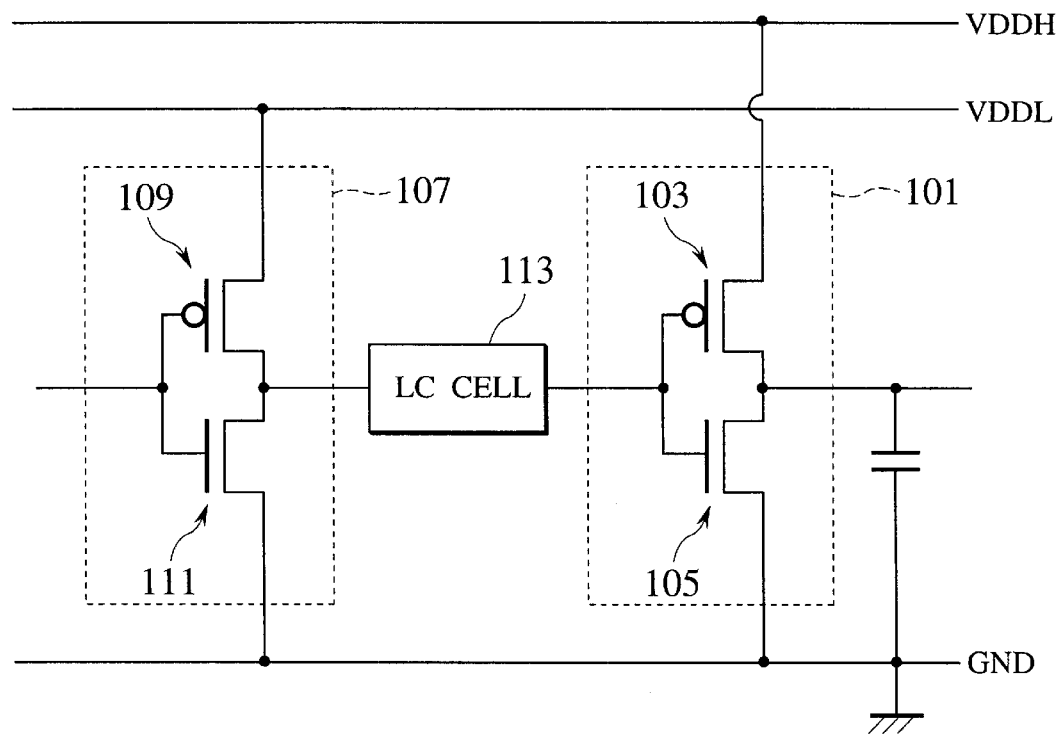
FIG. 2 is an equivalent circuit diagram showing the case where a level converter cell is provided between an output node of a low potential cell and an input node of a high potential cell, both constitute the dual power supply integrated circuit in FIG. 1.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First a multi power supply integrated circuit evaluating system according to the present invention will be explained, and than a multi power supply integrated circuit evaluating method according to the present invention will be explained with reference to four embodiments. The multi power supply integrated circuit as an evolution object has at least one primary input terminal and at least one primary output terminal. It comprises a plurality of cells each of which has at least one input node and at least one output node. In such cells, high potential cells (VDDH cells) driven by the high potential power supply voltage (VDDH), low potential cells (VDDL cells) driven by the low potential power supply voltage (VDDL), level converter cells for converting the VDDL level signal into the VDDH level signal, and level convertible cells, which has the function for converting the VDDL level signal into the VDDH level signal, are contained. For purpose of simplicity, a dual power supply integrated circuit in which two power supply voltages (a high potential power supply voltage (VDDH) and a low potential power supply voltage (VDDL)) are employed will be explained as the multi power supply integrated circuit hereinafter. For example, a combination of power supply voltages such as VDDH=5 V and VDDL=3.3 V, VDDH=3.3 V and VDDL=2.0, or the like may be employed.

Evaluating system

Figure 3:
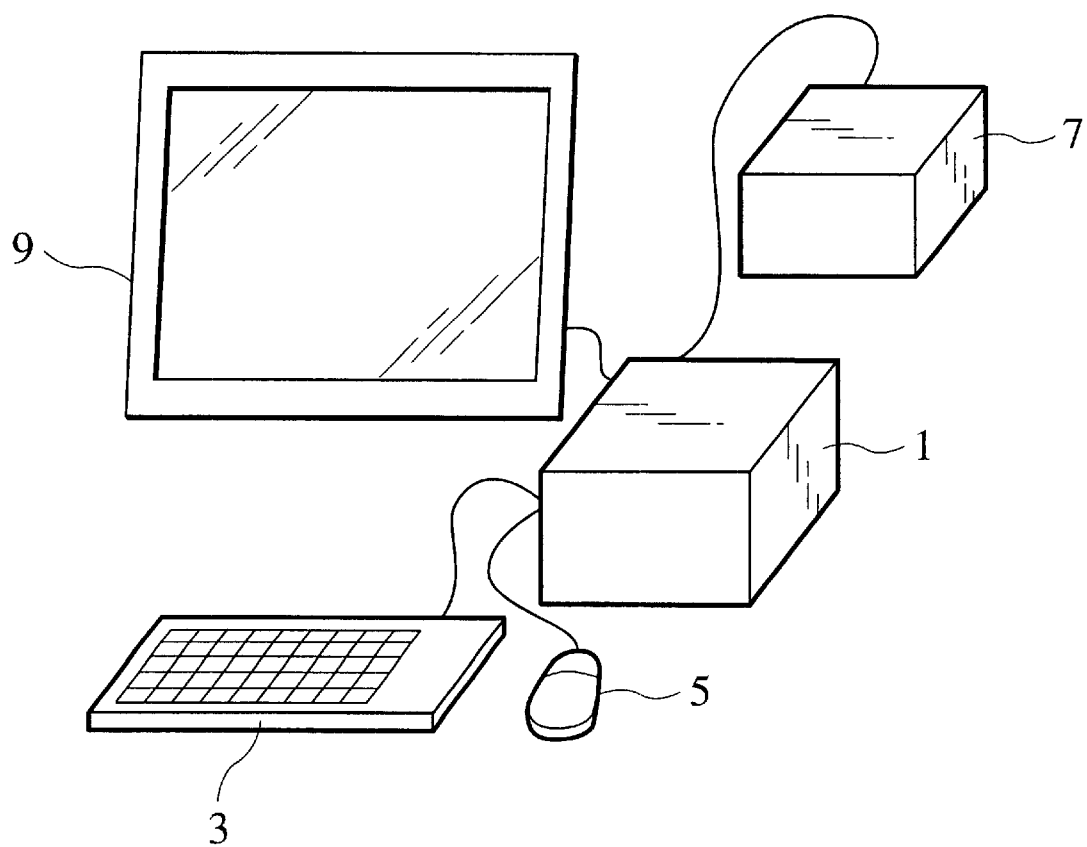
FIG. 3 is a schematic view showing a configuration of a computer system employed in respective embodiments of the present invention.

As the multi power supply integrated circuit evaluating system according to the present invention, a normal computer system may be employed. So-called general-purpose computer, workstation, PC, NC (Network Computer), etc. are employed as this computer system. As shown in FIG. 3, the computer system employed in the multi power supply integrated circuit evaluating system according to the present invention comprises a central processing unit 1 for executing various processes; an input device such as a keyboard 3, a mouse 5, a light pen (not shown), a flexible disk drive (not shown), etc.; a memory unit 7 such as a semiconductor memory device, e.g., ROM, RAM, etc., a disk unit, etc.; an output device such as a display unit 9, a printer unit (not shown), etc.; and others.

In the multi power supply integrated circuit evaluating system according to the present invention, the net list of the multi power supply integrated circuit as an evaluation object and the cell library in which various cells employed in design of the multi power supply integrated circuit are registered are input. The net list corresponds to design data which represent the connectivity between respective cells constituting the multi power supply integrated circuit. In such connectivity, the connections between respective cells and a primary terminal (a primary input terminal or a primary output terminal) in the evaluation object circuit are contained. As the language for design to describe the design data, there is a hardware description language, for example. There are VHDL, Verilog-HDL, etc. as the hardware description language. Well-known gate arrays, standard cells, etc. automatically generate layout data of a desired integrated circuit based on the net list. The cell library corresponds to a database in which a variety of cells, macrocells, megacells, gates, etc., which constitute the multi power supply integrated circuit, are collected. In this database, layout data, function data, etc. about various high potential cells (VDDH cells) driven by high potential power supply voltage (VDDH), various low potential cells (VDDL cells) driven by the low potential power supply voltage (VDDL), level converter cells for converting a low potential power supply voltage (VDDL) level signal into a high potential power supply voltage (VDDH) level signal, and level convertible cells which have a function for converting the low potential power supply voltage (VDDL) level signal into the high potential power supply voltage (VDDH) level signal therein are contained. The memory device 7 includes a compiler. The computer system shown in FIG. 3 describes the multi power supply integrated circuit evaluating method, which are described in first to fourth embodiments hereinafter, by the high level language such as C, Pascal, etc., then generates source codes, and then stores them in the memory device 7. The execution files being executed by the computer system can be prepared by translating the source codes into the object codes by using the compiler. Various evaluation methods can be carried out when the central processing unit 1 executes the execution files. In executing the multi power supply integrated circuit evaluating method, various data which are explained in respective embodiments hereinafter are saved in the memory device 7, etc., and then the central processing unit 1 reads saved data appropriately to execute the process. The output device such as the display unit 9, the printer unit, etc. outputs process results of the central processing unit 1.

The program employed to carry out the multi power supply integrated circuit evaluating method being explained in first to fourth embodiments of the present invention in the following can be stored in a storage medium. The desired multi power supply integrated circuit evaluating method can be implemented while controlling the computer system based on the program on the storage medium. In the storage medium, all devices or units which can store the program of the present invention, e.g., a semiconductor memory device, a magnetic disk drive, an optical disk drive, a magneto-optic disk drive, a magnetic tape unit, etc., are contained.

First embodiment

Figure 4:
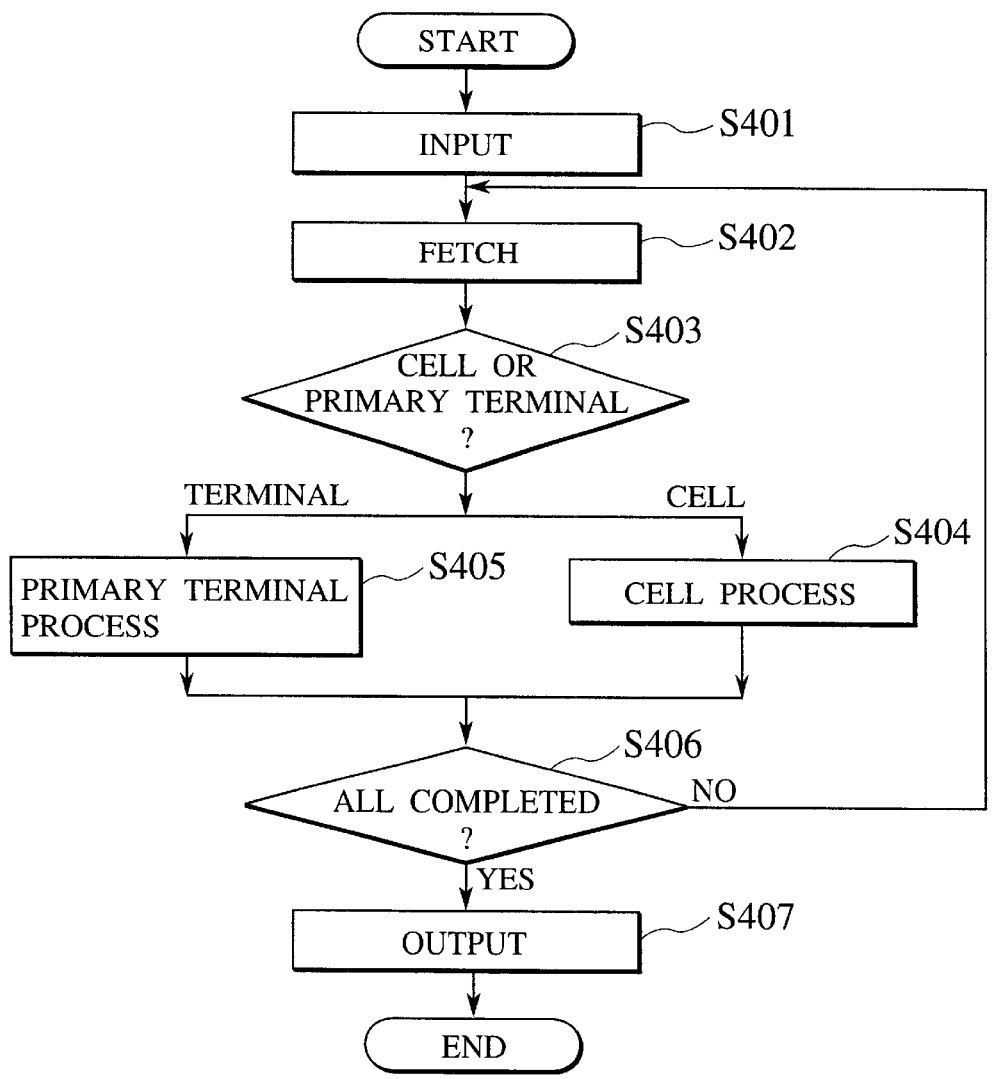
FIG. 4 is a flowchart showing processes in a multi power supply integrated circuit evaluating method according to respective embodiments of the present invention.
Figure 5:
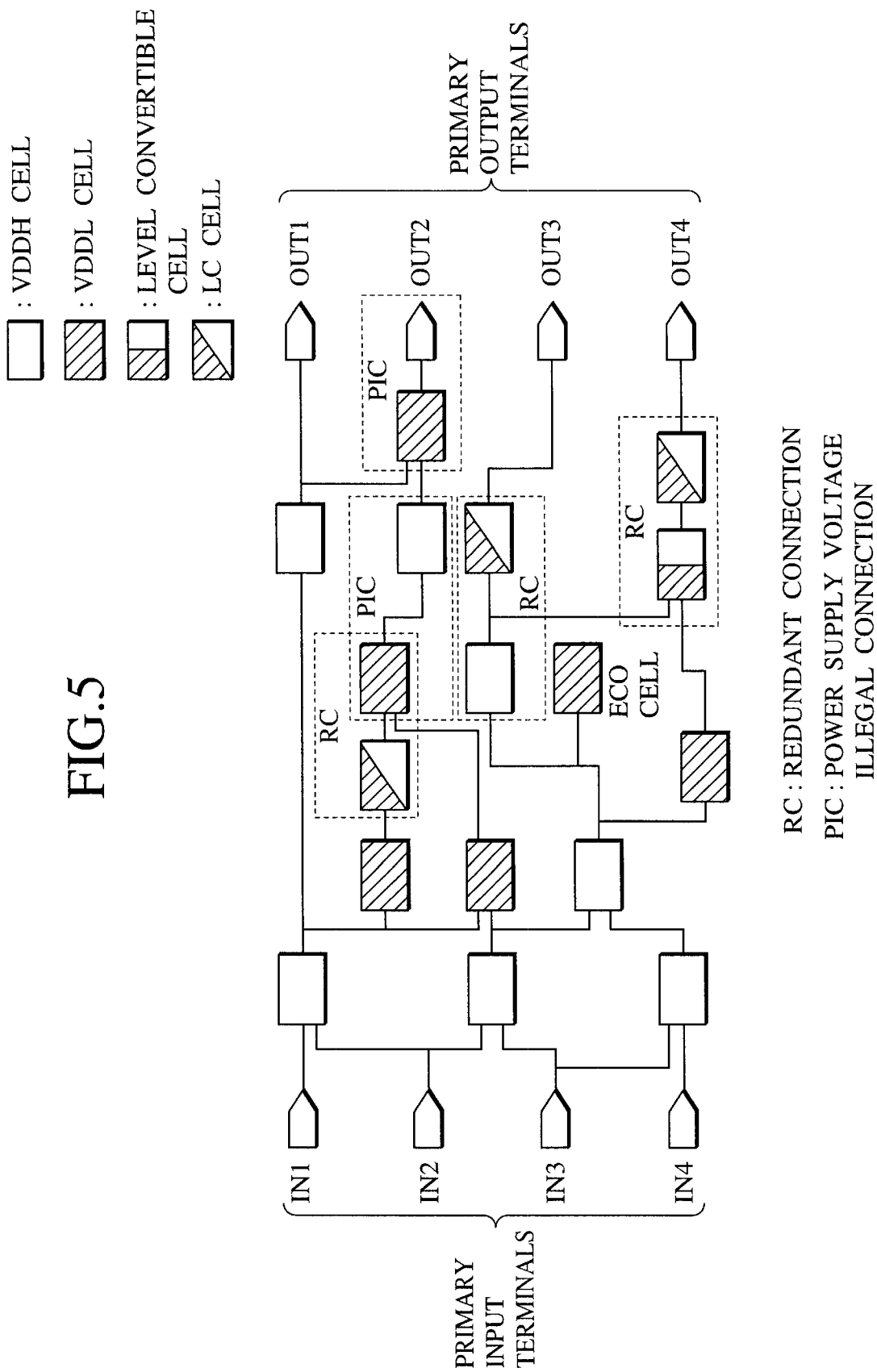
FIG. 5 is a view showing an example of a net list of the dual power supply integrated circuit.

Next, a multi power supply integrated circuit evaluating method according to a first embodiment of the present invention will be explained with reference to FIGS. 4 to 7 hereinafter. FIG. 4 is a flowchart showing process procedures in the multi power supply integrated circuit evaluating method according to a first embodiment of the present invention. FIG. 5 is a view showing an example of the net list of the dual power supply integrated circuit. As shown in FIG. 5, the dual power supply integrated circuit has primary input terminals IN1, IN2, IN3 and IN4 and primary output terminals OUT1, OUT2, OUT3 and OUT4. It comprises a plurality of cells each of which has at least one input node and at least one output node. The net list as illustrated in FIG. 5 includes two power supply voltage illegal connections and three redundant connections. In this case, assume that the primary input terminals and the primary output terminals are driven by the high potential power supply voltage (VDDH). Therefore, a connection between an output node of the VDDL cell and the primary output terminal is the power supply voltage illegal connection. When the program is started, first an input operation is executed in step S401. In step S401, information of the dual power supply integrated circuit as the evaluation object are input first. The input information contain the net list of the dual power supply integrated circuit as the evaluation object and the cell library in which cells employed in design of the dual power supply integrated circuit are registered. Then, all cells, primary input terminals, and primary output terminals contained in the input net list are extracted to formulate a fetch list. Then, a fetching operation is executed in step S402. In this step S402, one of the cells, the primary input terminals, and the primary output terminals being registered on the fetch list is picked up. The cells, etc. being registered on the fetch list are called the object. For example, a marking is applied to the picked-up object.

Next, a step S403 is executed. In step S403, it is checked whether the picked-up object correspond to the cell or the primary terminal (the primary input terminal or the primary output terminal). (A) If the object is the cell, the process goes to the cell process in step S404. (B) If the object is the primary terminal, the process goes to the primary terminal process in step S405.

Figure 6:
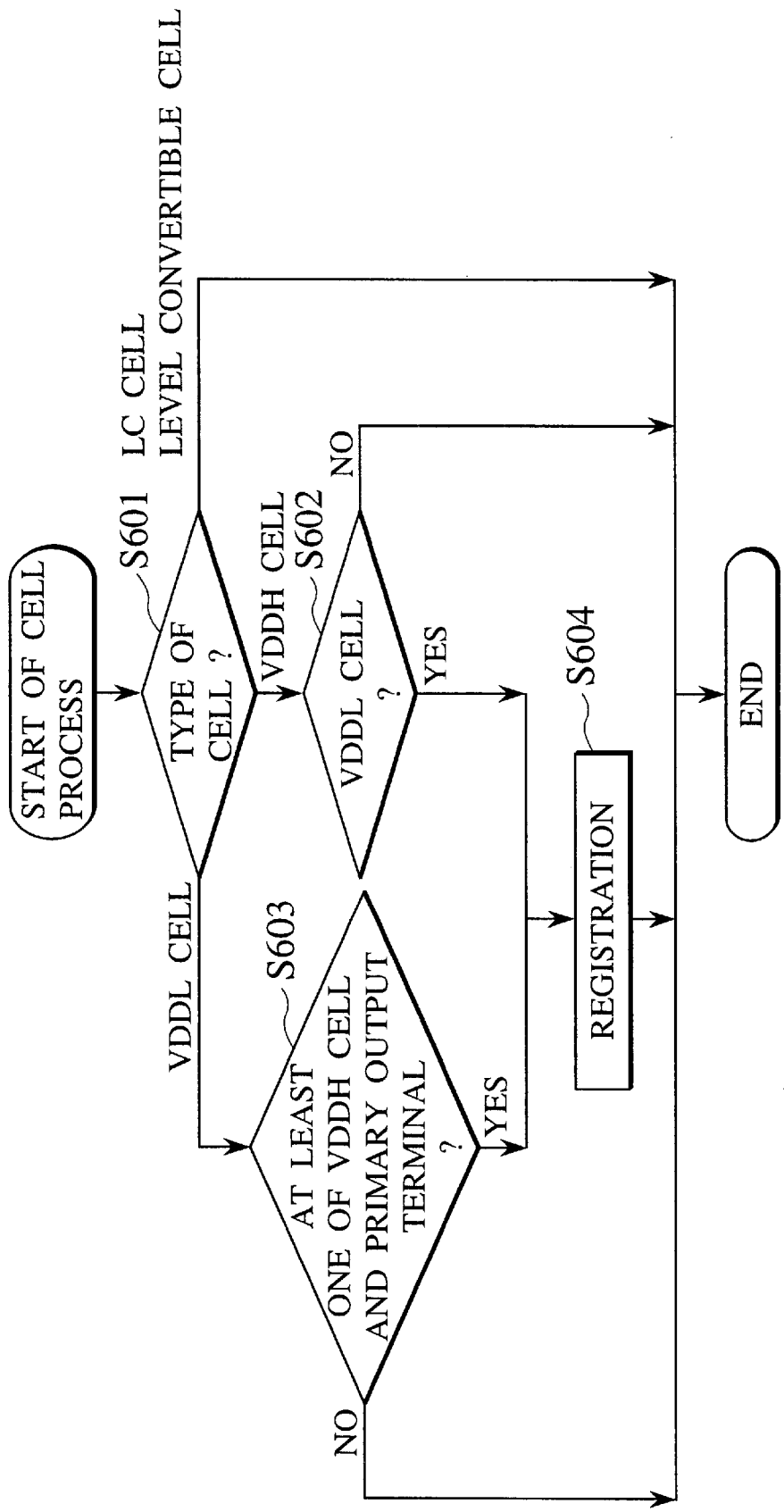
FIGS. 6 and 7 are flowcharts showing processes in steps S404 and S405 of a multi power supply integrated circuit evaluating method according to a first embodiment of the present invention respectively.

(A) The cell process in step S404 taken when the object is the cell is shown in FIG. 6. First, type of the cell is checked in step S601. More particularly, it is checked which one of the high potential cell (VDDH cell) driven by the high potential power supply voltage (VDD), the low potential cell (VDDL cell) driven by the low potential power supply voltage (VDDL), the level converter cell for converting the low potential power supply voltage (VDDL) level signal into the high potential power supply voltage (VDDH) level signal, and the level convertible cell, which has the function for converting the low potential power supply voltage (VDDL) level signal into the high potential power supply voltage (VDDH) level signal, the cell corresponds to. (1) If the cell corresponds to the level converter cell or the level convertible cell, no power supply voltage illegal connection is present at both an input node and an output node. Therefore, the cell process in step S404 is ended. (2) If the cell corresponds to the VDDH cell, the process advances to step S602. In step S602, it is checked whether or not the VDDL cell is connected to an input node of the VDDH cell. If the VDDL cell is connected (if YES in step S602), this connection between the VDDH cell and the VDDL cell is the power supply voltage illegal connection. The process then goes to step S604 wherein this connection is registered on an illegal list. The cell process in step S404 is ended. Nets and cell instances constituting this connection are registered on the illegal list. On the contrary, unless the VDDL cell is connected (if NO in step S602), no power supply voltage illegal connection is present. Therefore, the cell process in step S404 is ended. (3) If the cell corresponds to the VDDL cell, the process proceeds to step S603. In step S603, it is checked that at least one of the VDDH cell and the primary output terminal is connected to an output node of the VDDL cell. If at least one of the VDDH cell and the primary output terminal is connected (if YES in step S603), this connection between the VDDL cell and at least one of the VDDH cell and the primary output terminal is the power supply voltage illegal connection. The process then goes to step S604 wherein this connection is registered on the illegal list. The cell process in step S404 is ended. In contrast, unless both the VDDH cell and the primary output terminal are connected (if NO in step S603), this connection is not the power supply voltage illegal connection. Therefore, the cell process in step S404 is ended. When the picked-up cell has a plurality of nodes, the above-mentioned steps showing in FIG. 6 are carried out on all the nodes.

Figure 7:
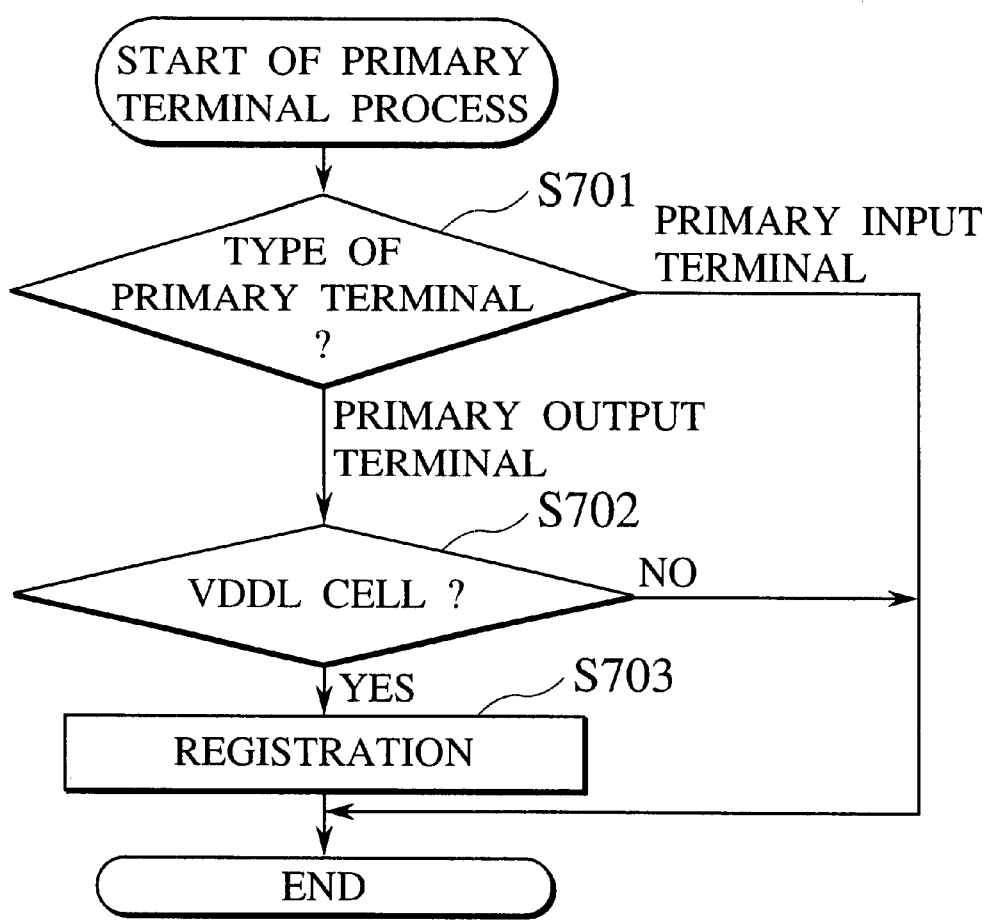

(B) The primary terminal process is step S405 taken when the object is the primary terminal is shown in FIG. 7. First it is checked in step S701 which one of the primary input terminal and the primary output terminal the primary terminal corresponds to. (1) If the primary terminal is the primary input terminal, no power supply voltage illegal connection exists at the primary input terminal. Therefore, the primary terminal process in step S405 is ended. (2) If the primary terminal is the primary output terminal, the process goes to step S702 wherein it is checked whether or not the VDDL cell is connected to the primary output terminal. If the VDDL cell is connected (if YES in step S702), this connection is the power supply voltage illegal connection. The process goes to step S703, this connection is registered on the illegal list. The primary terminal process in step S405 is then ended. In contrast, unless the VDDL cell is connected (if NO in step S702), no power supply voltage illegal connection is present. Therefore, the primary terminal process in step S405 is then ended. When the picked-up primary terminal has a plurality of nodes, the above-mentioned steps showing in FIG. 7 are carried out on all the nodes.

Returning to FIG. 4, it is checked in step S406 whether or not all objects contained in the fetch list have been picked up after the cell process is step S404 and the primary terminal process in step S405 in FIG. 4 have been executed as above. If the marking is applied to the picked-up objects, all objects may be checked depending upon whether or not the marking is present. Unless the process has been applied to all objects (if NO in step S406), the process is repeated once again from step S402. On the contrary, if the process has been applied to all objects (if YES in step S406), an output operation is executed in step S407 and then this program is ended. In this step S407, the illegal list is output. This illegal list outputs at least one of illegal connection nets and illegal cell instances, which constitute the power supply voltage illegal connection. The illegal list is output on a display screen, or is output as files.

In the first embodiment of the present invention, the inside of the circuit is searched from the primary input terminal side or the primary output terminal side by the existing searching approach based on input information of the dual power supply integrated circuit as the evaluation object, and detection of the power supply voltage illegal connection is executed in compliance with flowcharts shown in FIGS. 4 to 6. As one searching approach, the inside of the circuit may be searched from both of the primary input terminal side and the primary output terminal side. If the inside of the circuit is searched from both of the primary input terminal side and the primary output terminal side, the power supply voltage illegal connection can be detected from ECO (Engineering Change Order) cells which cannot be sometimes detected only by the search from one terminal side.

With the above, according to the multi power supply integrated circuit evaluating method according to the first embodiment of the present invention, the power supply voltage illegal connection in the stage of circuit design, which has not been achieved in the prior art, can be detected at high speed without fail. It is possible to correct the power supply voltage illegal connection easily in the design stage based on this detection, so that it can be guaranteed that the designed multi power supply integrated circuit can function as a low power consumption circuit.

Second embodiment

Next, a multi power supply integrated circuit evaluating method according to a second embodiment of the present invention will be explained with reference to FIGS. 8 to 14 hereinafter. Processes will be carried out along the flowcharts which have been explained in the above first embodiment. The multi power supply integrated circuit evaluating method according to the second embodiment of the present invention is characterized in that redundant connections and potential redundant connections can be detected further in the first embodiment shown in FIG. 4. In the second embodiment of the present invention, the term "redundant connection" means the connection in which the level converter cells or the level convertible cells are placed wastefully irrespective that no power supply voltage breach is caused. The term "potential redundant connection" means the connection in which the level converter cells or the level convertible cells are placed though they are not always necessary.

Like the above first embodiment, in the second embodiment of the present invention, it is checked in step S403 in FIG. 4 whether or not the picked-up object corresponds to either the cell or the primary terminal (the primary input terminal or the primary output terminal). (A) If the object is the cell, the process goes to the cell process in step S404. (B) If the object is the primary terminal, the process goes to the primary terminal process in step S405. In addition, in the second embodiment of the present invention, the redundant connections and the potential redundant connections in addition to the power supply voltage illegal connection are also detected in the cell process in step S404 and the primary terminal process in step S405.

Figure 8:
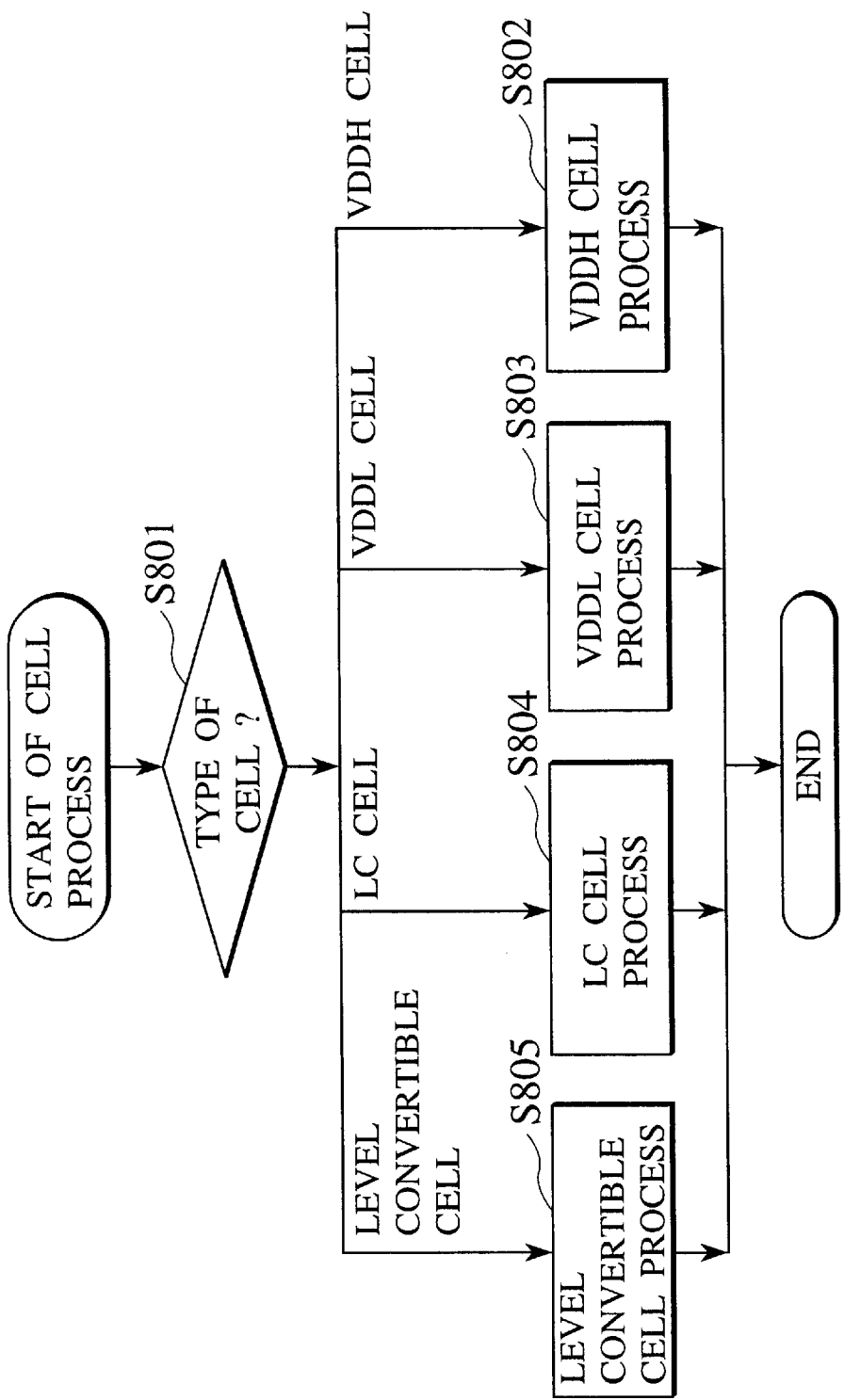
FIG. 8 is a flowchart showing processes in step S404 of a multi power supply integrated circuit evaluating method according to a second embodiment of the present invention.

(A) The cell process in step S404 taken when the object is the cell is shown in FIG. 8. First, it is checked which one of the high potential cell (VDDH cell) driven by the high potential power supply voltage (VDDH), the low potential cell (VDDL cell) driven by the low potential power supply voltage (VDDL), the level converter cell for converting the low potential power supply voltage (VDDL) level signal into the high potential power supply voltage (VDDH) level signal, and the level convertible cell, which has the function for converting the low potential power supply voltage (VDDL) level signal into the high potential power supply voltage (VDDH) level signal, the cell corresponds to. (1) If the cell corresponds to the VDDH cell, the process goes to the VDDH cell process in step S802. (2) If the cell corresponds to the VDDL cell, the process advances to the VDDL cell process in step S803. (3) If the cell corresponds to the level converter cell, the process proceeds to the level converter cell process in step S804. (4) If the cell corresponds to the level convertible cell, the process goes to the level convertible cell process in step S805.

Figure 9:
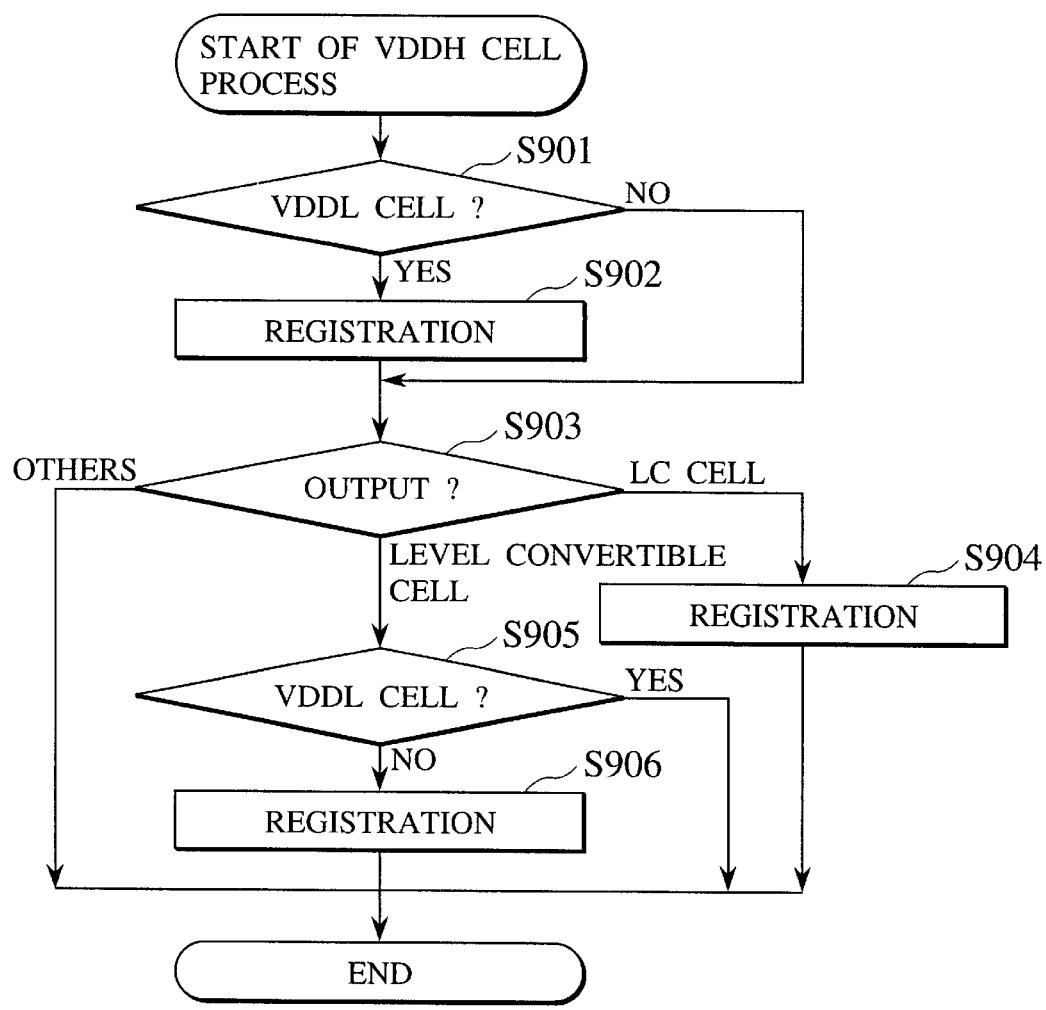
FIGS. 9 to 12 are flowcharts showing processes in steps S802 to S805 in FIG. 8 respectively.

(1) The VDDH cell process in step S802 in FIG. 8 is shown in FIG. 9. First, it is checked in step S901 whether or not the VDDL cell is connected to an input node of the VDDH cell. If the VDDL cell is connected (if YES in step S901), this connection between the VDDH cell can the VDDL cell is the power supply voltage illegal connection. The process goes to step S902 wherein this connection is registered on the illegal list. The process advances to step S903. On the contrary, unless the VDDL cell is connected (if NO in step S901), the process goes to step S903 as it is. Next, it is checked in step S903 which one of the level converter cell, the level convertible cell, and others is connected to an output node of the VDDH cell. (a) If the level converter cell is connected to the output node of the VDDH cell, this connection is the redundant connection. The process then goes to step S904, this connection is registered on a redundant list. Then, the VDDH cell process in step S802 in FIG. 8 is ended. (b) If the level convertible cell is connected to the output node of the VDDH cell, the process goes to step S905. It is then checked in step S905 whether or not the VDDL cell is connected to an input node of the level convertible cell. If the VDDL cell is connected (if YES in step S905), the VDDH cell process in step S802 is ended. In contrast, unless the VDDL cell is connected (if NO in step S905), this connection between the VDDH cell and the level convertible cell is the potential redundant connection. The process advances to step S906 wherein this connection is registered on a potential redundant list, and then the VDDH cell process in step S802 is ended. (c) In the case of others, the VDDH cell process in step S802 is ended as it is. When the picked-up cell has a plurality of nodes, the above-mentioned steps showing in FIG. 9 are carried out on all the nodes.

Figure 10:
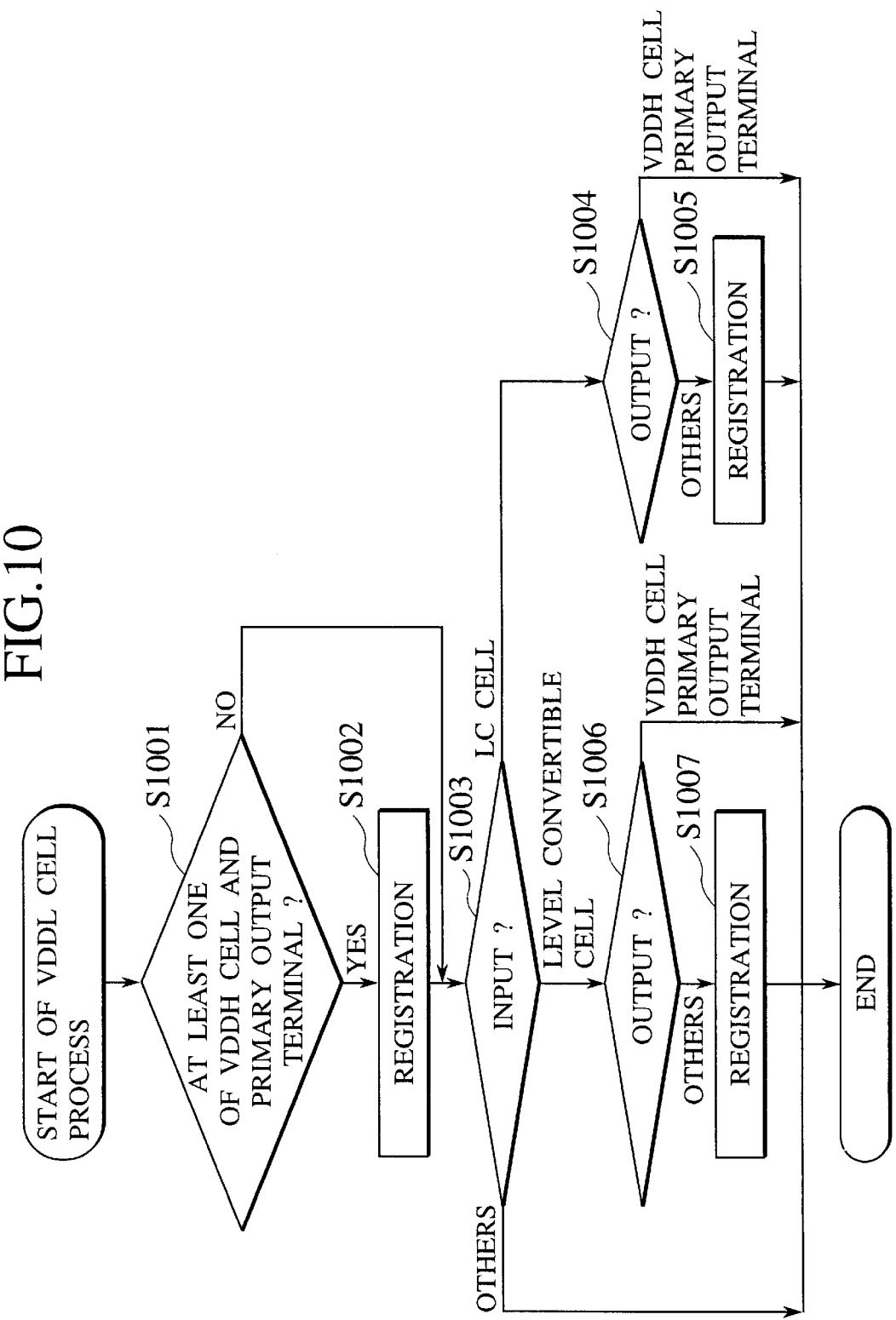

(2) The VDDL cell process in step S803 in FIG. 8 is shown in FIG. 10. First, it is checked in step S1001 whether or not at least one of the VDDH cell and the primary output terminal is connected to the output node of the VDDL cell. If at least one of the VDDH cell and the primary output terminal is connected (if YES in step S1001), this connection is the power supply voltage illegal connection. The process goes to step S1002 wherein this connection is registered on the illegal list, and then goes to step S1003. In contrast, if neither the VDDH cell nor the primary output terminal is connected (if NO in step S1001), the process goes to step S1003 as it is. Then, it is checked in step S1003 which one of the level converter cell, the level convertible cell, and others is connected to an input node of the VDDL cell. (a) If the level converter cell is connected to the input node of the VDDL cell, the process goes to step S1004. If is then checked in step S1004 whether or not at least one of the VDDH cell and the primary output terminal is connected to an output node of the level converter cell. If at least one of the VDDH cell and the primary output terminal is connected, the VDDL cell process in step S803 in FIG. 8 is ended. On the contrary, if neither the VDDH cell nor the primary output terminal is connected, this connection between the VDDL cell and the level converter cell is the redundant connection. The process goes to step 1005 wherein this connection is registered on the redundant list. Then, the VDDL cell process in step S803 in FIG. 8 is ended. (b) If the level convertible cell is connected to the input node of the VDDL cell, the process goes to step S1006. It is then checked in step S1006 whether or not at least one of the VDDH cell and the primary output terminal is connected the output node of the level convertible cell. If at least one of the VDDH cell and the primary output terminal is connected, the VDDL cell process in step S803 is ended. In contrast, if neither the VDDH cell nor the primary output terminal is connected, this connection between the VDDL cell and the level convertible cell is the potential redundant connection. The process advances to step S1007 wherein this connection is registered on the potential redundant list, and then the VDDL cell process in step S803 is terminated (c) In the case of others, the VDDL cell process in step S803 is ended as it is. When the picked-up cell has a plurality of nodes, the above-mentioned steps showing in FIG. 10 are carried out on all the nodes.

Figure 11:
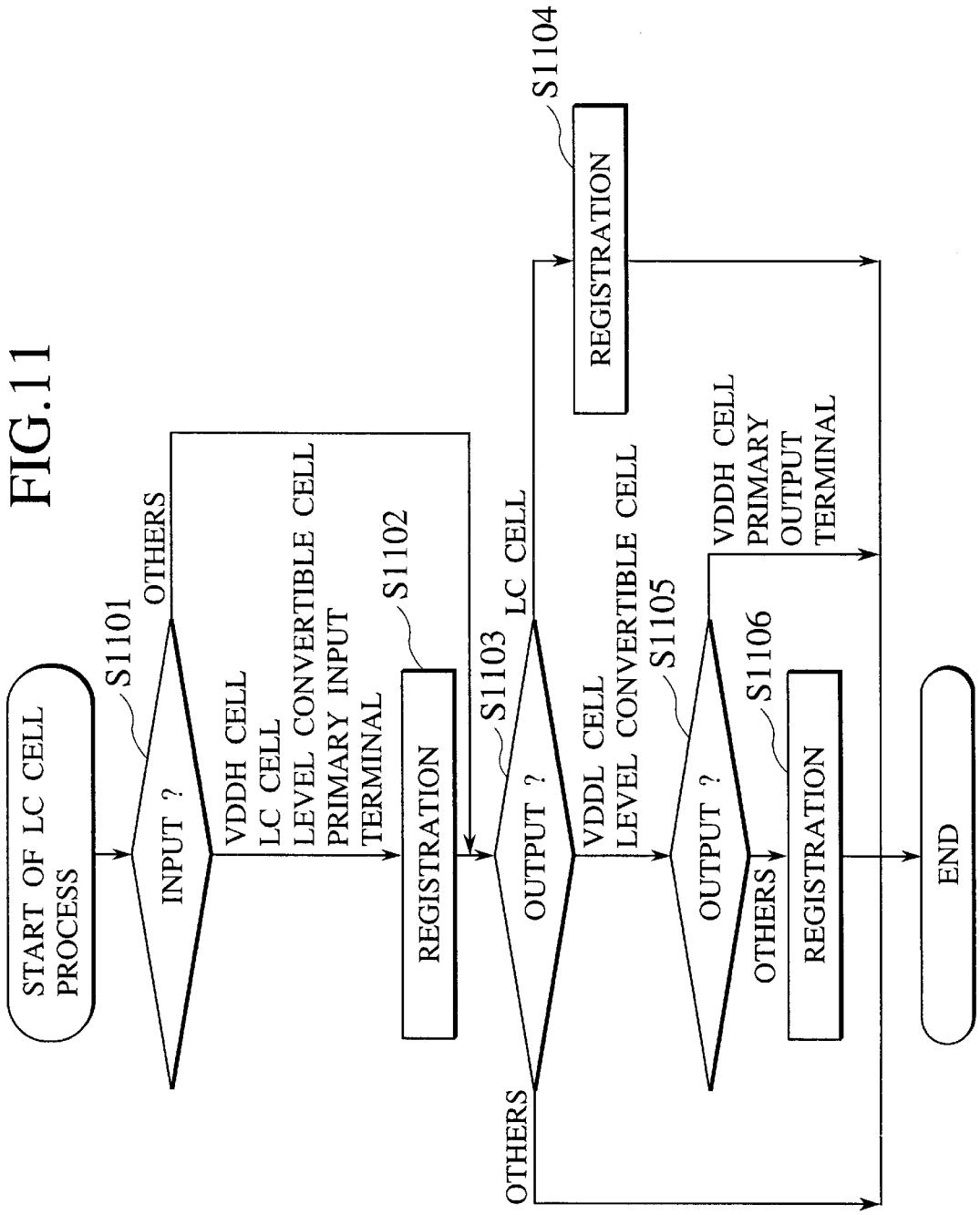

(3) The level converter cell process in step S804 in FIG. 8 is shown in FIG. 11. First, it is checked in step S1101 whether or not at least one of the VDDH cell, the level converter cell, the level convertible cell, and the primary input terminal is connected to an input node of the level converter cell. If at least one of the VDDH cell, the level converter cell, the level convertible cell, and the primary input terminal is connected, this connection is the redundant connection. The process goes to step S1102 wherein this connection is registered on the redundant list, and then goes to step S1103. In contrast, if none of the VDDH cell, the level converter cell, the level convertible cell, and the primary input terminal is connected, the process goes to step S1103 as it is. Then, it is checked in step S1103 what is connected to an output node of the level converter cell. (a) If another level converter cell is connected to the output node of the level converter cell, this connection is the redundant connection. The process goes to step S1104 wherein this connection is registered on the redundant list. The level converter cell process in step S804 in FIG. 8 is then added. (b) If at least one of the VDDL cell and the level convertible cell is connected to the output node of the level converter cell, the process goes to step S1105. It is then checked in step S1105 whether or not at least one of the VDDH cell and the primary output terminal is connected the output node of the level converter cell. If at least one of the VDDH cell and the primary output terminal is connected, the level converter cell process in step S804 is ended. In contrast, if neither the VDDH cell nor the primary output terminal is connected, this connection between the level converter cell and at least one of the VDDL cell and the level convertible cell is the redundant connection. The process advances to step S1106 wherein this connection is registered on the redundant list, and then the level converter cell process in step S804 is ended. (c) In the case of others, the level converter cell process in step S804 is ended as it is. When the picked-up cell has a plurality of nodes, the above-mentioned steps showing in FIG. 11 are carried out on all the nodes.

Figure 12:
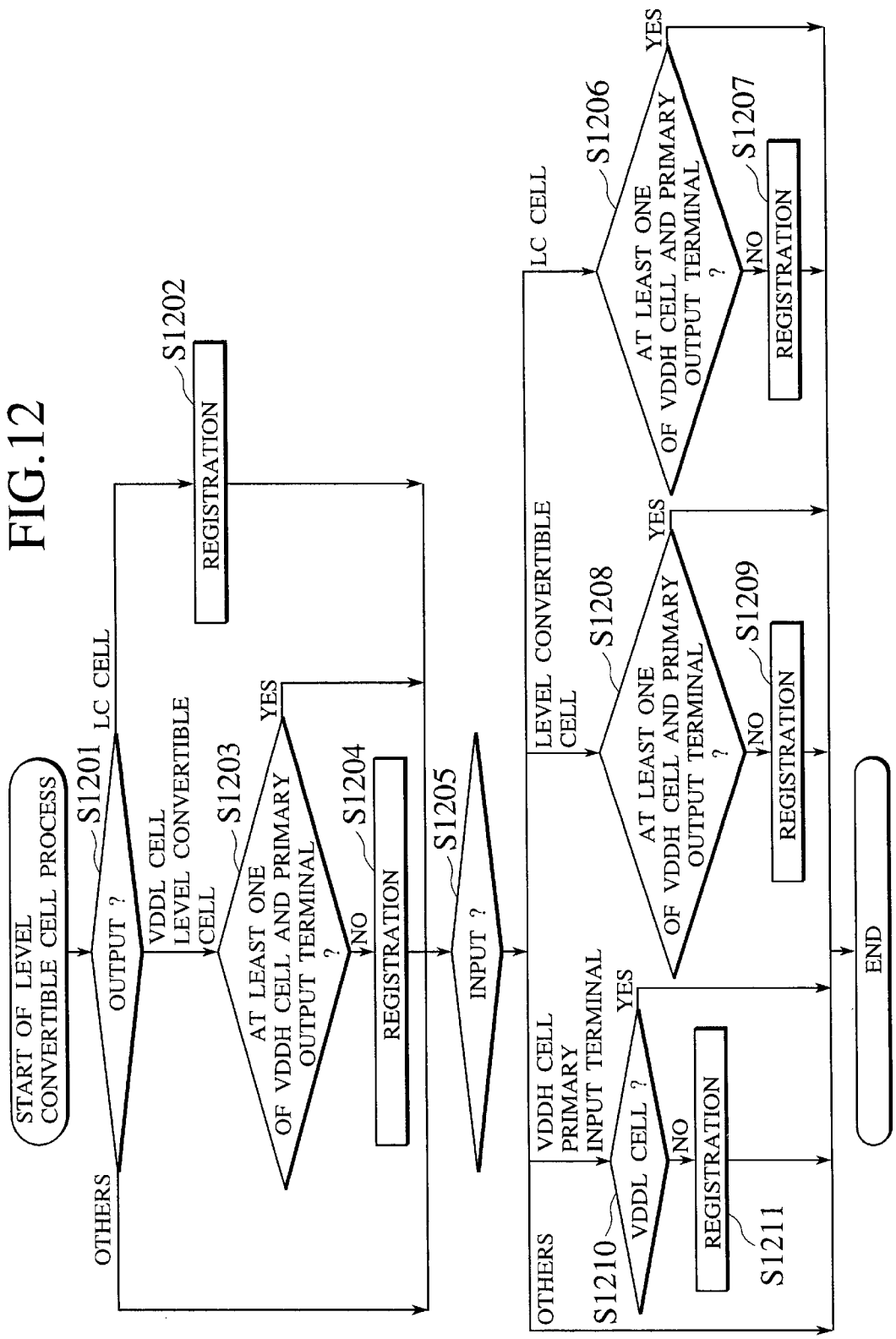

(4) The level convertible cell process in step S805 in FIG. 8 is shown in FIG. 12. First, it is checked in step S1201 what is connected to an output node of the level convertible cell. If the level converter cell is connected to the output node of the level convertible cell, this connection is the redundant connection. The process then goes to step S1202 to register this connection on the redundant list. The process then goes to step S1204. If at least one of the VDDL cell and another level convertible cell is connected to the output node of the level convertible cell, the process goes to step S1203. It is then checked in step S1203 whether or not at least one of the VDDH cell and the primary output terminal is connected the output node of the level convertible cell. It at least one of the VDDH cell and the primary output terminal is connected (if YES in step S1203), the process advances to step S1205. In contrast, if neither the VDDH cell nor the primary output terminal is connected (if NO in step S1203), this connection between the level converter cell and at least one of the VDDL cell and the another level convertible cell is the potential redundant connection. The process advances to step S1204 wherein this connection is registered on the potential redundant list. The process then goes to step S1205. In the case of others, the process then goes to step S1205 as it is.

Next, it is checked in step S1205 what is connected to an input node of the picked-up level convertible cell. (a) If the level converter cell is connected to the input node of the level convertible cell, the process advances to step S1206. It is checked in step S1206 whether or not at least one of the VDDH cell and the primary output terminal is connected to an output node of the level convertible cell. It at least one of the VDDH cell and the primary output terminal is connected (if YES in step S1206), the level convertible cell process in step S805 in FIG. 8 is ended. In contrast, if none of the VDDH cell and the primary output terminal is connected (if NO in step S1206), this connection between the level convertible cell and the level converter cell is the redundant connection. The process then proceeds to step S1207 wherein this connection is registered on the redundant list. Then, the level convertible cell process in step S805 in FIG. 8 is ended. (b) If another level convertible cell is connected to the input node of the level convertible cell, the process goes to step S1208. It is checked in step S1207 whether or not at least one of the VDDH cell and the primary output terminal is connected to the output node of the another level convertible cell. If at least one of the VDDH cell and the primary output terminal is connected (is YES in step S1208), the level convertible cell process in step S805 in FIG. 8 is then ended. Conversely, if none of the VDDH cell and the primary output terminal is connected (if NO in step S1208), this connection between the level convertible cell and the another level convertible cell is the potential redundant connection. The process advances to step S1209 to register this connection on the potential redundant list. Then, the level convertible cell process in step S805 in FIG. 8 is ended. (c) If at least one of the VDDH cell and the primary input terminal is connected to the input node of the level convertible cell, the process goes to step S1210. It is checked in step S1210 whether or not the VDDL cell is connected to the input node of the level convertible cell. If the VDDL cell is connected (if YES in S1210), the level convertible cell process in step S805 in FIG. 8 is ended. On the contrary, unless the VDDL cell is connected (if NO in S1210), the connection between the level convertible cell and at least one of the VDDH cell and the primary input terminal is the potential redundant connection. The process proceeds to step S1210 to register this connection on the potential redundant list. Then, the level convertible cell process in step S805 in FIG. 8 is ended. (d) In the case of others, the level convertible cell process in step S805 in FIG. 8 is ended as it is. When the picked-up cell has plurality of nodes, the above-mentioned steps showing in FIG. 12 are carried out on all the nodes.

Figure 13:
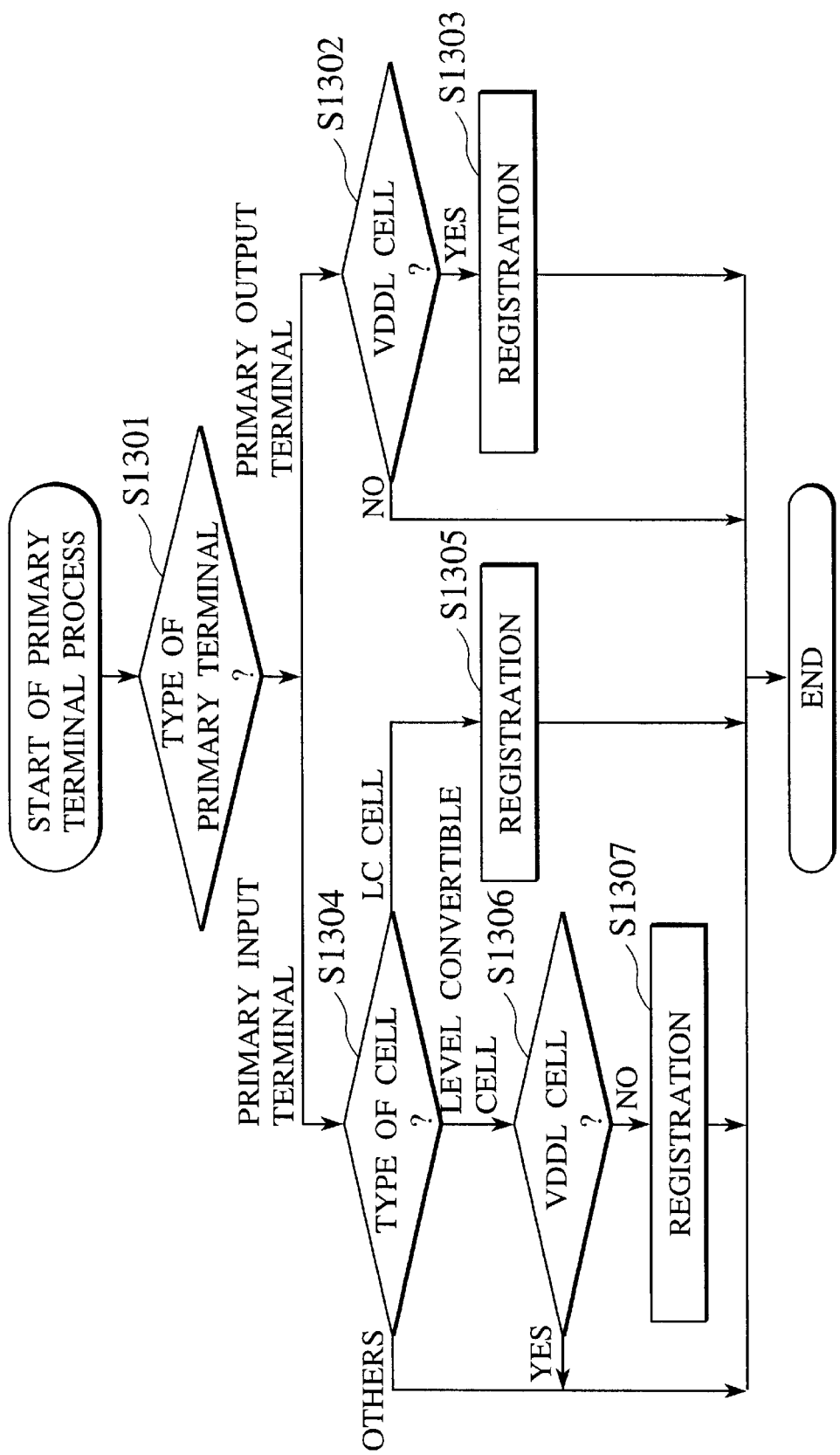
FIG. 13 is a flowchart showing processes in step S405 of the multi power supply integrated circuit evaluating method according to the second embodiment of the present invention.

(B) The primary terminal process, i.e., the primary input terminal and the primary output terminal process, in step S405 taken when the object is the primary terminal is shown in FIG. 13. First, it is checked in step S1301 which one of the primary output terminal and the primary input terminal corresponds to this primary terminal. (a) If the primary terminal is the primary output terminal, the process goes to step S1302. It is then checked in step S1302 whether or not the VDDL cell is connected to the primary output terminal. If the VDDL cell is connected (if YES in step S1302), this connection is the power supply voltage illegal connection. The process goes to step S1303 to register this connection on the illegal list. Then, the primary terminal process in step S405 is ended. In contrast, unless the VDDL cell is connected (if NO in step S1302), no power supply voltage illegal connection exists. Therefore, the primary terminal process in step S405 is ended. (b) If the primary terminal is the primary input terminal, the process goes to step S1304. It is then checked in step S1304 what is connected to the primary input terminal. (i) If the level converter cell is connected to the primary input terminal, this connection is the redundant connection. The process advances to step S1305 wherein this connection is registered in the redundant list. Then, the primary terminal process in step S405 is ended. (ii) If the level convertible call is connected to the primary input terminal, the process goes to S1306. It is then checked in step S1306 whether or not the VDDL cell is connected to an input node of the level convertible cell. Unless the VDDL cell is connected (if NO in step S1306), this connection between the primary input terminal and the level convertible cell is the potential redundant connection. The process goes to step S1307 wherein this connection is registered on the potential redundant list. Then, the primary terminal process in step S405 is ended. On the other hand. If the VDDL cell is connected (if YES in step S1306), the primary terminal process in step S405 is then ended. (iii) In the case of others, the primary terminal process in step S405 is ended as it is. When the picked-up primary terminal has a plurality of nodes, the above-mentioned steps showing in FIG. 13 are carried out on all the nodes. Since other processes are similar to those in the above first embodiment, their explanation will be omitted.

In the second embodiment of the present invention, based on input information of the dual power supply integrated circuit as the evaluation object, the inside of the circuit is searched by the existing searching method from the primary input terminal output side or the primary output terminal output side of the dual power supply integrated circuit, and then the connections having the power supply voltage illegal connection, the redundant connection, and the potential redundant connection are detected in compliance with the above flowcharts. In detecting such connections, for example, a table shown in FIG. 14 may be prepared previously and then respective connections may be detected in accordance with this table.

As described above, according to the multi power supply integrated circuit evaluating method according to the second embodiment of the present invention, not only the power supply voltage illegal connection but also the redundant connection and the potential redundant connection can be detected at high speed without fail. According to such detection, it is possible to correct easily the power supply voltage illegal connection, the redundant connection, and the potential redundant connection in the design stage. As a result, it is guaranteed that the designed multi power supply integrated circuit can function as the low power consumption circuit.

Third embodiment

Next, a multi power supply integrated circuit evaluating method according to a third embodiment of the present invention will be explained hereunder. The multi power supply integrated circuit evaluating method according to the third embodiment of the present invention is characterized in that the detected power supply voltage illegal connections can be corrected automatically in the above first and second embodiments. The multi power supply integrated circuit evaluating method according to the third embodiment of the present invention executes the processes along the steps in the flowcharts explained in the above first and second embodiments, but can correct automatically the power supply voltage illegal connections which are registered on the illegal list based on following approaches to overcome the breach of the power supply voltage.

In the third embodiment of the present invention, following three approaches will be employed in correcting automatically the power supply voltage illegal connections.

First approach

A first approach will be executed through following procedures.

(1) In the case of the connection between the output node of the VDDL cell and the input node of the VDDH cell, the level converter cell is inserted therebetween. If the level convertible cell which has the same function as the VDDL cell is registered on the cell library, the VDDL cell is replaced with the level convertible cell.

(2) In the case of the connection between the output node of the VDDL cell and the primary output terminal, the level converter cell is inserted therebetween. If the level convertible cell which has the same function as the VDDL cell is present, the VDDL cell is replaced with the level convertible cell.

Second approach

A second approach will be executed through following procedures.

(1) In the case of the connection between the output node of the VDDL cell and the input node of the VDDH cell, the VDDH cell is replaced with the VDDL cell. In addition, if the VDDH cell is connected to the output node of the replaced VDDL cell, the VDDH cell is further replaced with the VDDL cell. In the similar way, this process is repeated until the connection between the output node of the VDDL cell and the input node of the VDDH cell can be eliminated.

(2) If the primary output terminal is connected to the output node of the replaced VDDL cell, the level converter cell is inserted between the VDDL cell and the primary output terminal. If the level convertible cell which has the same function as the VDDL cell is present, the VDDL cell is replaced with the level convertible cell.

Third approach

A third approach will be executed through following procedures.

(1) In the case of the connection between the output node of the VDDL cell and the input node of the VDDH cell, the VDDL cell is replaced with the VDDH cell having the same function.

(2) If the VDDL cell is connected to the input node of the replaced VDDH cell, the VDDL cell is further replaced with the VDDH cell having the same function. Similarly, the above process is repeated until the connection between the output node of the VDDL cell and the input node of the VDDH cell can be eliminated.

In the case the timing constraint of the circuit is not taken into consideration, the power supply voltage illegal connection is corrected automatically by using any of above three approaches. Meanwhile, in case the timing constraint should be taken into consideration, three approaches may be employed in the order of the second approach, the first approach, and the third approach. This is because lower power consumption of the circuit can be achieved by this order. In this case, the net list which is given as the input information is guaranteed in timing previously at a certain power supply voltage, the net list which is guaranteed surely in timing can be derived by the third approach even in the worst case.

As described above, according to the multi power supply integrated circuit evaluating method according to the third embodiment of the present invention, the detected power supply voltage illegal connection can be correct automatically.

Fourth embodiment

Next, a multi power supply integrated circuit evaluating method according to a fourth embodiment of the present invention will be explained hereunder. A feature of the multi power supply integrated circuit evaluating method according to the fourth embodiment of the present invention resides in that both the detected redundant connection and the detected potential redundant connection can be corrected automatically in the above first, second and third embodiments. The multi power supply integrated circuit evaluating method according to the fourth embodiment of the present invention executes the processes along the steps of the flowcharts explained in the above first, second and third embodiments, but can correct automatically the redundant connection and the potential redundant connection which are registered on the redundant list and the potential redundant list based on following approaches to overcome the redundant connection and the potential redundant connection.

In the fourth embodiment of the present invention, a following approach will be employed in correcting automatically the redundant connection and the potential redundant connection.

(1) The level converter cells having the redundant connection are deleted.

(2) The level convertible cells having the potential redundant connection are replaced with the VDDH cell or the VDDL cell having the same function. The "potential redundant connection" means the connection in which the level convertible cell is not arranged automatically, i.e., the level converter cell or the level convertible cell is arranged although it is not always required as above. Therefore, in case the level convertible cell is arranged intentionally by some cause, the level convertible cell is not replaced with the VDDH cell or the VDDL cell. This judgment is made by the designer.

Figure 15:
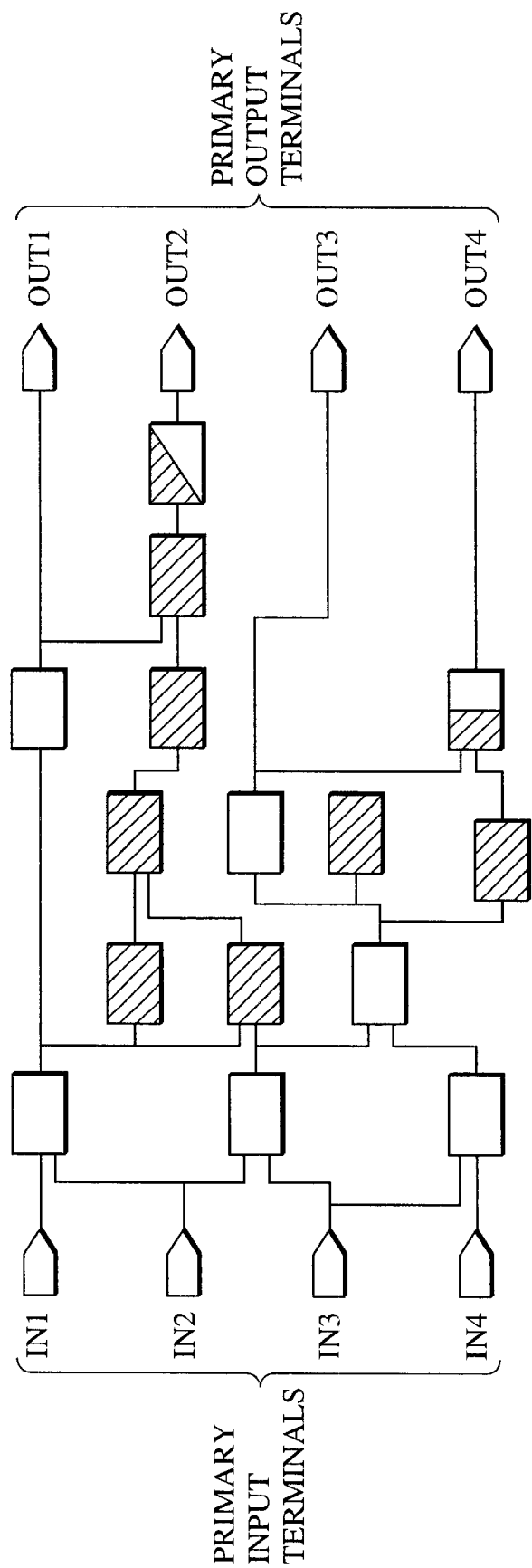
FIG. 15 is a view showing results in which the net list of the dual power supply integrated circuit shown in FIG. 5 is automatically corrected by a multi power supply integrated circuit evaluating method according to a fourth embodiment of the present invention.

The automatic correction of the power supply voltage illegal connection explained in the above third embodiment is carried out after the redundant connection and the potential redundant connection have been corrected. This is because, if the redundant connection and the potential redundant connection are corrected precedingly, a margin of the circuit timing is created. FIG. 15 is a view showing results in which the dual power supply integrated circuit shown in FIG. 5 is automatically corrected by the multi power supply integrated circuit evaluating method according to the fourth embodiment of the present invention. As shown in FIG. 15, according to the fourth embodiment of the present invention, the optimal net list in which the power supply voltage illegal connection and the redundant connection are removed can be derived automatically from the net list which contains the power supply voltage illegal connection and the redundant connection.

As described above, according to the multi power supply integrated circuit evaluating system and the multi power supply integrated circuit evaluating method of the present invention, it is guaranteed in the stage of circuit design that the designed multi power supply integrated circuit can function as the low power consumption circuit. In this case, the two power supply voltage case is explained in the first to fourth embodiments, but the present invention is not limited to the two power supply voltage case. The present invention is also true of a multi power supply integrated circuit utilizing a plurality of power supply voltages.

Various modifications will become possible for those skilled in the art after receiving the teachings of the present disclosure without departing from the scope thereof.

What is claimed is:

1. A system for evaluating a multi power supply integrated circuit which has at least one primary input terminal and at least one primary output terminal and consists of a plurality of cells in combination, comprising:

(a) means for inputting a database, in which a plurality of first cells each of which has at least one input node and at least one output node and is driven by a first power supply voltage, a plurality of second cells each of which has at least one input node and at least one output node and is driven by a second power supply voltage lower than the first power supply voltage, a plurality of third cells each of which has at least one input node and at least one output node and converts signals at the second power supply voltage level into the signals at the first power supply voltage level, and a plurality of fourth cells each of which has at least one input node and at least one output node and has a function for converting signals at the second power supply voltage level into the signals at the first power supply voltage level therein are registered, and connection descriptions between the cells constituting the multi power supply integrated circuit, between the cells and the primary input terminal, and between the cells and the primary output terminal;

(b) means for detecting a first connection between the output node of the second cell and the input node of the first cell and a second connection between the output node of the second cell and the primary output terminal, by using the database and the connection descriptions;

(c) means for registering the first connection and the second connection being detected as power supply voltage illegal connections; and (d) means for outputting registered power supply voltage illegal connections.

2. The system according to claim 1, wherein the detecting means detects further a third connection between the output node of the first cell and the input node of the third cell, a fourth connection between the output node of the third cell and the input node of the second cell and neither the input node of the first cell nor the primary output terminal is connected to the other output nodes of the third cell, a fifth connection between the third cells, a sixth connection between the input node of the third cell and the output node of the fourth cell, a seventh connection between the input node of the fourth cell and the output node of the third cell and neither the input node of the first cell nor the primary output terminal is connected to the other output nodes of the third cell, an eighth connection between the primary input terminal and the input node of the third cell, a ninth connection between the output node of the first cell and the input node of the fourth cell and the output node of the second cell is not connected to the other output nodes of the fourth cell, a tenth connection between the output node of the fourth cell and the input node of the second cell and neither the input node of the first cell nor the primary output terminal is connected to the other output nodes of the fourth cell, an eleventh connection between the fourth cells and neither the input node of the first cell nor the primary output terminal is connected to the output node of the fourth cell on an input side, and a twelfth connection between the primary input terminal and the input node of the fourth cell and the output node of the second cell is not connected to the other input nodes of the fourth cell, the registering means further registers detected third to eighth connections as a redundant connection, and registers detected ninth to twelfth connections as a potential redundant connection, and the outputting means further outputs registered redundant connections and registered potential redundant connections.

3. The system according to claim 1, further comprising:

means for correcting the first connection and the second connection by using one of the first approach which corrects the first connection by inserting the third cell between the second cell and the first cell and corrects the second connection by inserting the third cell between the second cell and the primary output terminal, a second approach which replaces the first cell with the second cell, replaces the first cell with the second cell if the input node of the first cell is connected to the output node of the present cell being replaced, corrects the first connection by repeating replacement until the first connection is eliminated, and corrects the second connection by inserting the third cell between the second cell and the primary output terminal, and a third approach which replaces the second cell with the first cell, replaces the second cell with the first cell if the output node of the second cell is connected to the input node of the first cell being replaced, and corrects the first connection and the second connection by repeating replacement until the first connection and the second connection are eliminated, and then updating the connection descriptions of the multi power supply integrated circuit based on correction results.

4. The system according to claim 3, wherein the correcting and updating means employs respective approaches in correcting the first connection and the second connection in an order of the second approach, the first approach, and the third approach, and does not execute correction if breach of timing is caused in corrected results and employs a succeeding approach.

5. The system according to claim 1, further comprising:

means for correcting the first connection and the second connection by using one of a first approach which corrects the first connection and the second connection by replacing the second cell with the fourth cell having a same function, a second approach which replaces the first cell with the second cell, replaces further the first cell with the second cell if the input node of the first cell is connected to the output node of the second cell being replaced, corrects the first connection by repeating replacement until the first connection is eliminated, and corrects the second connection by replacing the second cell with the fourth cell having the same function, and a third approach which replaces the second cell with the first cell, replaces further the second cell with the first cell if the output node of the second cell is connected to the input node of the first cell being replaced, and corrects the first connection and the second connection by repeating replacement until the first connection and the second connection are eliminated, and then updating the connection description of the multi power supply integrated circuit based on correction results.

6. The system according to claim 5, wherein the correcting and updating means employs respective approaches in correcting the first connection and the second connection in an order of the second approach, the first approach, and the third approach, and does not execute correction if breach of timing is caused in corrected results and employs a succeeding approach.

7. The system according to claim 2, further comprising:
means for correcting the first connection and the second connection by using one of a first approach which corrects the first connection by inserting the third cell between the second cell and the first cell and corrects the second connection by inserting the third cell between the second cell and the primary output terminal, a second approach which replaces the first cell with the second cell, replaces the first cell with the second cell if the input node of the first cell is connected to the output node of the second cell being replaced, corrects the first connection by repeating replacement until the first connection is eliminated, and corrects the second connection by inserting the third cell between the second cell and the primary output terminal, and a third approach which replaces the second cell with the first cell, replaces the second cell with the first cell if the output node of the second cell is connected to the input node of the first cell being replaced, and corrects the first connection and the second connection by repeating replacement until the first connection and the second connection are eliminated, then executing correction of the third connection to the eighth connection by deleting the third cell constituting the third connection to the eighth connection, then executing correction of the ninth connection to the twelfth connection by replacing the fourth cell constituting the ninth connection to the twelfth connection with the first cell of the second cell having a same function, and then updating the connection descriptions of the multi power supply integrated circuit based on correction results.

8. The system according to claim 7, wherein the correcting and updating means employs respective approaches in correcting the first connection and the second connection in an order of the second approach, the first approach, and the third approach, and does not execute correction if breach of timing is caused in corrected results and employs a succeeding approach.

9. The system according to claim 2, further comprising:
means for correcting the first connection and the second connection by using one of a first approach which corrects the first connection and the second connection by replacing the second cell with the fourth cell having a same function, a second approach which replaces the first cell with the second cell, replaces further the first cell with the second cell if the input node of the first cell is connected to the output node of the second cell being replaced, corrects the first connection by repeating replacement until the first connection is eliminated, and corrects the second connection by replacing the second cell with the fourth cell having the same function, and a third approach which replaces the second cell with the first cell, replaces further the second cell with the first cell if the output node of the second cell is connected to the input node of the first cell being replaced, and corrects the first connection and the second connection by repeating replacement until the first connection and the second connection are eliminated, then executing correction of the third connection to the eighth connection by deleting the third cell constituting the third connection to the eighth connection, then executing correction of the ninth connection to the twelfth connection by replacing the fourth cell constituting the ninth connection to the twelfth connection with the first cell or the second cell having a same function, and then updating the connection descriptions of the multi power supply integrated circuit based on correction results.

10. The system according to claim 9, wherein the correcting and updating means employs respective approaches in correcting the first connection and the second connection in an order of the second approach, the first approach, and the third approach, and does not execute correction if breach of timing is caused in corrected results and employs a succeeding approach.

11. A method of evaluating a multi power supply integrated circuit which has at least one primary input terminal and at least one primary output terminal and consists of a plurality of cells in combination, comprising the steps of:

(a) inputting a database, in which a plurality of first cells each of which has at least one input node and at least one output node and is driven by a first power supply voltage, a plurality of second cells each of which has at least one input node and at least one output node and is driven by a second power supply voltage lower than the first power supply voltage, a plurality of third cells each of which has at least one input node and at least one output node and converts signals at the second power supply voltage level into signals at the first power supply voltage level, and a plurality of fourth cells each of which has at least one input node and at least one output node and has a function for converting the signals at the second power supply voltage level into the signals at the first power supply voltage level therein are registered, and connection descriptions between the cells constituting the multi power supply integrated circuit, between the cells and the primary input terminal, and between the cells and the primary output terminal;

(b) detecting a first connection between the output node of the second cell and the input node of the first cell and a second connection between the output node of the second cell and the primary output terminal, by using the database and the connection descriptions;

(c) registering the first connection and the second connection being detected as power supply voltage illegal connections; and (d) outputting registered power supply voltage illegal connections.

12. The method according to claim 11, wherein the detecting step detects further a third connection between the output node of the first cell and the input node of the third cell, a fourth connection between the output node of the third cell and the input node of the second cell and neither the input node of the first cell nor the primary output terminal is connected to the other output nodes of the third cell, a fifth connection between the third cells, a sixth connection between the input node of the third cell and the output node of the fourth cell, a seventh connection between the input node of the fourth cell and the output node of the third cell and neither the input node of the first cell nor the primary output terminal is connected to the other output nodes of the third cell, an eighth connection between the primary input terminal and the input node of the third cell, a ninth connection between the output node of the first cell and the input node of the fourth cell and the output node of the second cell is not connected to the other output nodes of the fourth cell, a tenth connection between the output node of the fourth cell and the input node of the fourth cell and neither the input node of the first cell nor the primary output terminal is connected to the other output nodes of the fourth cell, an eleventh connection between the fourth cells and neither the input node of the first cell nor the primary output terminal is connected to the output node of the fourth cell on an input side, and a twelfth connection between the primary input terminal and the input node of the fourth cell and the output node of the second cell is not connected to the other input nodes of the fourth cell, the registering step further registers detected third to eighth connections as a redundant connection, and registers detected ninth to twelfth connections as a potential redundant connection, and the outputting step further outputs registered redundant connections and registered potential redundant connections.

13. The method according to claim 11, further comprising the steps of:

correcting the first connection and the second connection by using one of a first approach which corrects the first connection by inserting the third cell between the second cell and the first cell and corrects the second connection by inserting the third cell between the second cell and the primary output terminal, a second approach which replaces the first cell with the second cell, replaces the first cell with the second cell if the input node of the first cell is connected to the output node of the second cell being replaced, corrects the first connection by repeating replacement until the first connection is eliminated, and corrects the second connection by inserting the third cell between the second cell and the primary output terminal, and a third approach which replaces the second cell with the first cell, replaces the second cell with the first cell if the output node of the second cell is connected to the input node of the first cell being replaced, and corrects the first connection and the second connection by repeating replacement until the first connection and the second connection are eliminated, and updating the connection descriptions of the multi power supply integrated circuit based on correction results.

14. The method according to claim 13, wherein the correcting and updating steps employ respective approaches in correcting the first connection and the second connection in an order of the second approach, the first approach, and the third approach, and do not execute correction if breach of timing is caused in corrected results and employ a succeeding approach.

15. The method according to claim 11, further comprising the steps of:

correcting the first connection and the second connection by using one of a first approach which corrects the first connection and the second connection by replacing the second cell with the fourth cell having a same function, a second approach which replaces the first cell with the second cell, replaces further the first cell with the second cell if the input node of the first cell is connected to the output node of the second cell being replaced, corrects the first connection by repeating replacement until the first connection is eliminated, and corrects the second connection by replacing the second cell with the fourth cell having the same function, and a third approach which replaces the second cell with the first cell, replaces further the second cell with the first cell if the output node of the second cell is connected to the input node of the first cell being replaced, and corrects the first connection and the second connection by repeating replacement until the first connection and the second connection are eliminated, and updating the connection descriptions of the multi power supply integrated circuit based on correction results.

16. The method according to claim 15, wherein the correcting and updating steps employ respective approaches in correcting the first connection and the second connection in an order of the second approach, and first approach, and the third approach, and do not execute correction if breach of timing is caused in corrected results and employ a succeeding approach.

17. The method according to claim 12, further comprising the steps of:

correcting the first connection and the second connection by using of a first approach which corrects the first connection by inserting the third cell between the second cell and the first cell and corrects the second connection by inserting the third cell between the second cell and the primary output terminal, a second approach which replaces the first cell with the second cell, replaces the first cell with the second cell if the input node of the first cell is connected to the output node of the second cell being replaced, corrects the first connection by repeating replacement until the first connection is eliminated, and corrects the second connection by inserting the third cell between the second cell and the primary output terminal, and a third approach which replaces the second cell with the first cell, replaces the second cell with the first cell if the output node of the second cell is connected to the input node of the first cell being replaced, and corrects the first connection and the second connection by repeating replacement until the first connection and the second connection are eliminated, executing correction of the third connection to the eighth connection by deleting the third cell constituting the third connection to the eighth connection, executing correction of the ninth connection to the twelfth connection by replacing the fourth cell constituting the ninth connection to the twelfth connection with the first cell or the second cell having a same function, and updating the connection descriptions of the multi power supply integrated circuit based on correction results.

18. The method according to claim 17, wherein the correcting and updating steps employ respective approaches in correcting the first connection and the second connection in an order of the second approach, the first approach, and the third approach, and do not execute correction if breach of timing is caused in corrected results and employ a succeeding approach.

19. The method according to claim 12, further comprising the steps of:

correcting the first connection and the second connection by using one of a first approach which corrects the first connection and the second connection by replacing the second cell with the fourth cell having a same function, a second approach which replaces the first cell with the second cell, replaces further the first cell with the second cell if the input node of the first cell is connected to the output node of the second cell being replaced, corrects the first connection by repeating replacement until the first connection is eliminated, and corrects the second connection by replacing the second cell with the fourth cell having the same function, and a third approach which replaces the second cell with the first cell, replaces further the second cell with the first cell if the output node of the second cell is connected to the input node of the first cell being replaced, and corrects the first connection and the second connection by repeating replacement until the first connection and the second connection are eliminated, then executing correction of the third connection to the eighth connection by deleting the third cell constituting the third connection to the eighth connection, then executing correction of the ninth connection to the twelfth connection by replacing the fourth cell constituting the ninth connection to the twelfth connection with the first cell or the second cell having a same function, and then updating the connection descriptions of the multi power supply integrated circuit based on correction results.

20. The method according to claim 19, wherein the correcting and updating steps employ respective approaches in correcting the first connection and the second connection in an order of the second approach, the first approach, and the third approach, and do not execute correction if breach of timing is caused in corrected results and employ a succeeding approach.

* * * * *